United States Patent [19]

Inada

[11] Patent Number: 6,030,265
[45] Date of Patent: Feb. 29, 2000

US006030265A

[54] METHOD OF MANUFACTURING LIQUID CRYSTAL DISPLAY DEVICE

[75] Inventor: Katsuhiko Inada, Himeji, Japan

[73] Assignee: Kabushiki Kaisha Toshiba, Kawasaki, Japan

[21] Appl. No.: 08/895,922

[22] Filed: Jul. 17, 1997

[30] Foreign Application Priority Data

Jul. 18, 1996 [JP] Japan .................................. 8-189003

[51] Int. Cl.[7] ...................................................... H01J 9/00
[52] U.S. Cl. ............................................. 445/24; 445/23
[58] Field of Search ................................ 445/24, 49, 50, 445/23

[56] References Cited

FOREIGN PATENT DOCUMENTS

WO95/16276  6/1995  Japan .

*Primary Examiner*—Nimeshkumar D. Patel
*Assistant Examiner*—Michael J. Smith

*Attorney, Agent, or Firm*—Pillsbury Madison & Sutro LLP

[57] ABSTRACT

A method of manufacturing an array substrate for a display device having a surface area including a display area having a plurality of pixel electrode arranged on a main surface of an insulating substrate, a peripheral area positioned at the outside of the display area to supply a drive voltage to the display area, and a mark area positioned at the outside of the peripheral area, including the steps of forming a first layer on a main surface of the insulating substrate, forming a resist on the first layer, and patterning the first layer by exposing the resist using a plurality of mask patterns which correspond to each area obtained by dividing of the surface area, wherein adjacent divided areas of the first substrate area and the second substrate area are patterned with a common mask having two mask patterns each used in each of the first substrate area and the second substrate area of each area obtained by dividing of the surface area. According to the present invention, in spite of using the highly accurate exposure technique, increases in manufacturing time and cost can be restrained in manufacturing the array substrate for the display device.

7 Claims, 8 Drawing Sheets

| (Div. 1-1) | (Div. 1-2) t2 | (Div. 1-3) t2 | (Div. 1-4) t3 |
|---|---|---|---|
| t1 | (Div. 1-5) A1 | (Div. 1-6) A1 | (Div. 1-7) A1 | (Div. 1-8) r1 |
| (Div. 1-9) ℓ1 | (Div. 1-10) A1 | (Div. 1-11) A1 | (Div. 1-12) A1 | (Div. 1-13) r1 |
| (Div. 1-14) b1 | (Div. 1-15) b2 | (Div. 1-16) b2 | (Div. 1-17) b3 |
| (Div. 2-1) | (Div. 2-2) t2 | (Div. 2-3) t2 | (Div. 2-4) t3 |
| t1 | (Div. 2-5) A1 | (Div. 2-6) A1 | (Div. 2-7) A1 | (Div. 2-8) r1 |
| (Div. 2-9) ℓ1 | (Div. 2-10) A1 | (Div. 2-11) A1 | (Div. 2-12) A1 | (Div. 2-13) r1 |
| (Div. 2-14) b1 | (Div. 2-15) b2 | (Div. 2-16) b2 | (Div. 2-17) b3 |

| (Div. 1-1) | (Div. 1-2) t2 | (Div. 1-3) t2 | (Div. 1-4) t3 |
|---|---|---|---|
| t1 | (Div. 1-5) A1 | (Div. 1-6) A1 | (Div. 1-7) A1 | (Div. 1-8) r1 |
| (Div. 1-9) ℓ1 | (Div. 1-10) A1 | (Div. 1-11) A1 | (Div. 1-12) A1 | (Div. 1-13) r1 |
| (Div. 1-14) b1 | (Div. 1-15) b2 | (Div. 1-16) b2 | (Div. 1-17) b3 |
| (Div. 2-1) | (Div. 2-2) t2 | (Div. 2-3) t2 | (Div. 2-4) t3 |
| t1 | (Div. 2-5) A1 | (Div. 2-6) A1 | (Div. 2-7) A1 | (Div. 2-8) r1 |
| (Div. 2-9) ℓ1 | (Div. 2-10) A1 | (Div. 2-11) A1 | (Div. 2-12) A1 | (Div. 2-13) r1 |
| (Div. 2-14) b1 | (Div. 2-15) b2 | (Div. 2-16) b2 | (Div. 2-17) b3 |

FIG. 5

1-1 MASK 1-2 MASK 1-3 MASK 1-4 MASK

| (Div. 3) | (Div. 1-1) C | (Div. 1-2) A2 | (Div. 1-3) A2 | (Div. 1-4) D | (Div. 4) |
|---|---|---|---|---|---|
| | (Div. 1-5) E | (Div. 1-6) B | (Div. 1-7) B | (Div. 1-8) F | |
| | (Div. 2-1) C | (Div. 2-2) A2 | (Div. 2-3) A2 | (Div. 2-4) D | |
| | (Div. 2-5) E | (Div. 2-6) B | (Div. 2-7) B | (Div. 2-8) F | |

FIG. 7

2-1 MASK 2-2 MASK 2-3 MASK 2-4 MASK

FIG. 9
(PRIOR ART)

METHOD OF MANUFACTURING LIQUID CRYSTAL DISPLAY DEVICE

BACKGROUND OF THE INVENTION

The present invention relates to a method of manufacturing an array substrate for a display device and relates more particularly to a manufacturing method using divisional exposing method.

A flat display device such as a liquid crystal display device is light weight, thin, and consumes a low amount of electric power as compared with a display device such as a CRT (cathode ray tube). Because of such features, the flat display device has been recently employed in various kinds of devices such as a television display device, a computer display device, and a car navigation display device, which receives a signal from a satellite to detect a current position of the car and display the position of the car on the route to a particular destination.

Particularly, an active matrix type display device, which uses a switch element such as a thin film transistor (hereinafter called TFT) or an MIM (Metal Insulator Metal) element for each display pixel, can realize a good display image having no crosstalk between adjacent pixels. This type of the display device has been actively studied and developed.

The following will briefly explain the technique of the prior art, e.g., the liquid crystal display device of the active matrix type using thin film transistors as switch elements:

Specifically, the liquid crystal display device of the active matrix type includes an array substrate having a plurality of pixel electrodes arrayed, an opposite substrate having an opposite electrode formed, and a liquid crystal composition as an optical modulation layer sealed between both substrates. The array substrate is formed by the transparent insulating substrate such as glass and the pixel electrodes, which are connected to the TFTs, are disposed on the substrate in a matrix manner. Moreover, on the array substrate, scanning lines, signal lines, and storage capacitor lines for providing storage capacitors (Cs) are provided. The scanning lines are connected in common to the gate electrode of the TFTs arrayed in rows. The signal lines are connected in common to the drain electrode of the TFTs arrayed in columns. The storage capacitor lines are arranged to be opposite to the each pixel electrode so that an insulating layer may be formed between the each storage capacitor line and each corresponding pixel electrode.

In the array substrate of the active matrix type liquid crystal display, an insulating film, a conductive film or a dielectric film are formed. Then, resist coating, exposure, development, and patterning are repeated to manufacture the array substrate.

In the flat display device, e.g., a large size liquid crystal display device, having a high precision display image is required, and an exposure technique exhibiting high precision is needed to realize such a requirement.

For example, as shown in FIG. 9, there is known a divisional exposure method. In this method, the resist provided on the substrate is divided into a plurality of areas, and each area is exposed.

In the example of FIG. 9, an array substrate 100 including a display area at the center is divided into 18 areas, because of the limited size of the effective exposure area of each photomask, and each area is exposed. Display areas l1, l2, r1, r2, t1 to t4 and b1 to b4 of the array substrate shown by A of FIG. 9 correspond to non-display areas.

According to the above method, exposure with high precision can be realized. However, the respective layers of the array substrate must be repeatedly exposed sequentially by use of photomasks corresponding to A, l1, l2, r1, r2, t1 to t4, and b1 to b4. Due to this, and exposure must be performed eighteen times.

Such exposure is repeated for each respective layer. Since the number of the division areas is large, manufacturing time is increased.

BRIEF SUMMARY OF THE INVENTION

An object of the present invention is to provide a method of manufacturing an array substrate for a display device which can reduce manufacturing time and reduce costs while using the highly accurate exposure technique.

According to the present invention, there is provided a method of manufacturing an array substrate for a display device having a surface area including a display area having a plurality of pixel electrodes arranged on a main surface of an insulating substrate, a peripheral area positioned at the outside of the display area to supply a drive voltage to the display area, and a mark area positioned at the outside of the peripheral area. The method comprises forming a first layer on a main surface of the insulating substrate; forming a first resist on the first layer; patterning the first layer by exposing the first resist using a plurality of mask patterns which correspond to each area obtained by division of the surface area; forming a second layer on the first layer; forming a second resist on the second layer; and patterning the second layer by exposing the second resist using a plurality of mask patterns which correspond to each area obtained by division of the surface area except the mark area.

Also, according to the present invention, there is provided a method of manufacturing an array substrate for a display device having a surface area including a display area having a plurality of pixel electrodes arranged on a main surface of an insulating substrate, a peripheral area positioned at the outside of the display area to supply a drive voltage to the display area, and a mark area positioned at the outside of the peripheral area. The method comprises forming a first layer on a main surface of the insulating substrate; forming a first resist on the first layer; patterning the first layer by exposing the first resist using a plurality of mask patterns which correspond to each area obtained by division of the surface except the mark area; forming a second layer on the first layer; forming a second resist on the second layer; and patterning the second layer by exposing the second resist using a plurality of mask patterns which correspond to each area obtained by division of the surface area.

Furthermore, according to the present invention, there is provided a method of manufacturing an array substrate for a display device having a surface area including a first substrate area having a first display area having a plurality of pixel electrodes arranged on a main surface of an insulating substrate and a second substrate area having a second display area having a plurality of pixel electrodes arranged on the main surface of the insulating substrate. The method comprises forming a first layer on a main surface of the insulating substrate; forming a resist on the first layer; and patterning the first layer by exposing the resist using a plurality of mask patterns which correspond to each area obtained by division of the surface area, wherein adjacent divided areas of the first substrate area and the second substrate area are patterned with a common mask having two mask patterns each used in each of the first substrate area and the second substrate area of each area obtained by division of the surface area.

Moreover, according to the present invention, there is provided a method of manufacturing an array substrate for a display device having a surface area including a display area having a plurality of pixel electrodes arranged on a main surface of an insulating substrate, comprising forming a first layer on a main surface of the insulating substrate; forming a resist on the first layer; and patterning the first layer of a main surface of the insulating substrate by exposing the resist using a plurality of mask patterns which correspond to each area obtained by division of the surface area, wherein two areas of the each area are patterned by using a mask, the mask has two mask patterns corresponding to each the two areas.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a view showing division areas of divisional exposure according to the manufacture of the array substrate used in the liquid crystal display device of FIG. 3;

FIG. 7 is a view explaining the division areas of the divisional exposure according to the manufacture of the array substrate used in the liquid crystal display device of FIG. 3;

Figure 9:
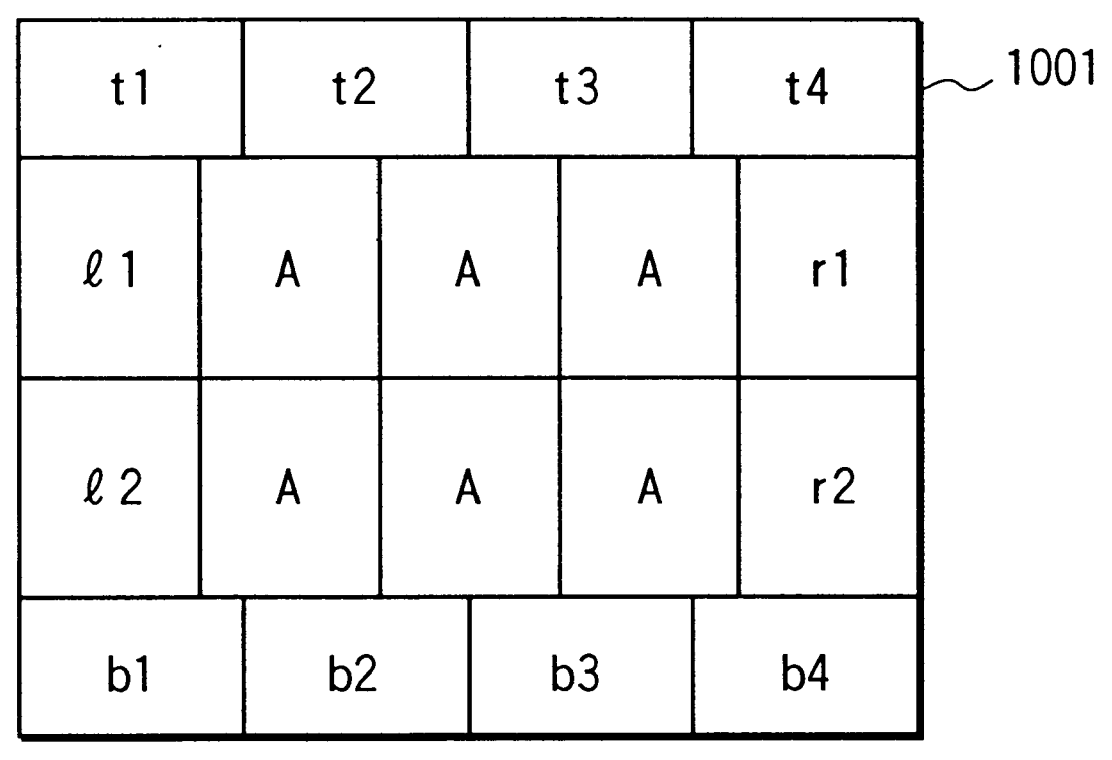

FIG. 9 is a schematic view explaining the division areas of the divisional exposure to manufacture an array substrate conventionally used in the display device.

DETAILED DESCRIPTION OF THE INVENTION

The following will explain an active matrix type liquid crystal display device of a light transmission type having an effective display area whose diagonal size is 12.1 according to one embodiment of the present invention.

Figure 1:
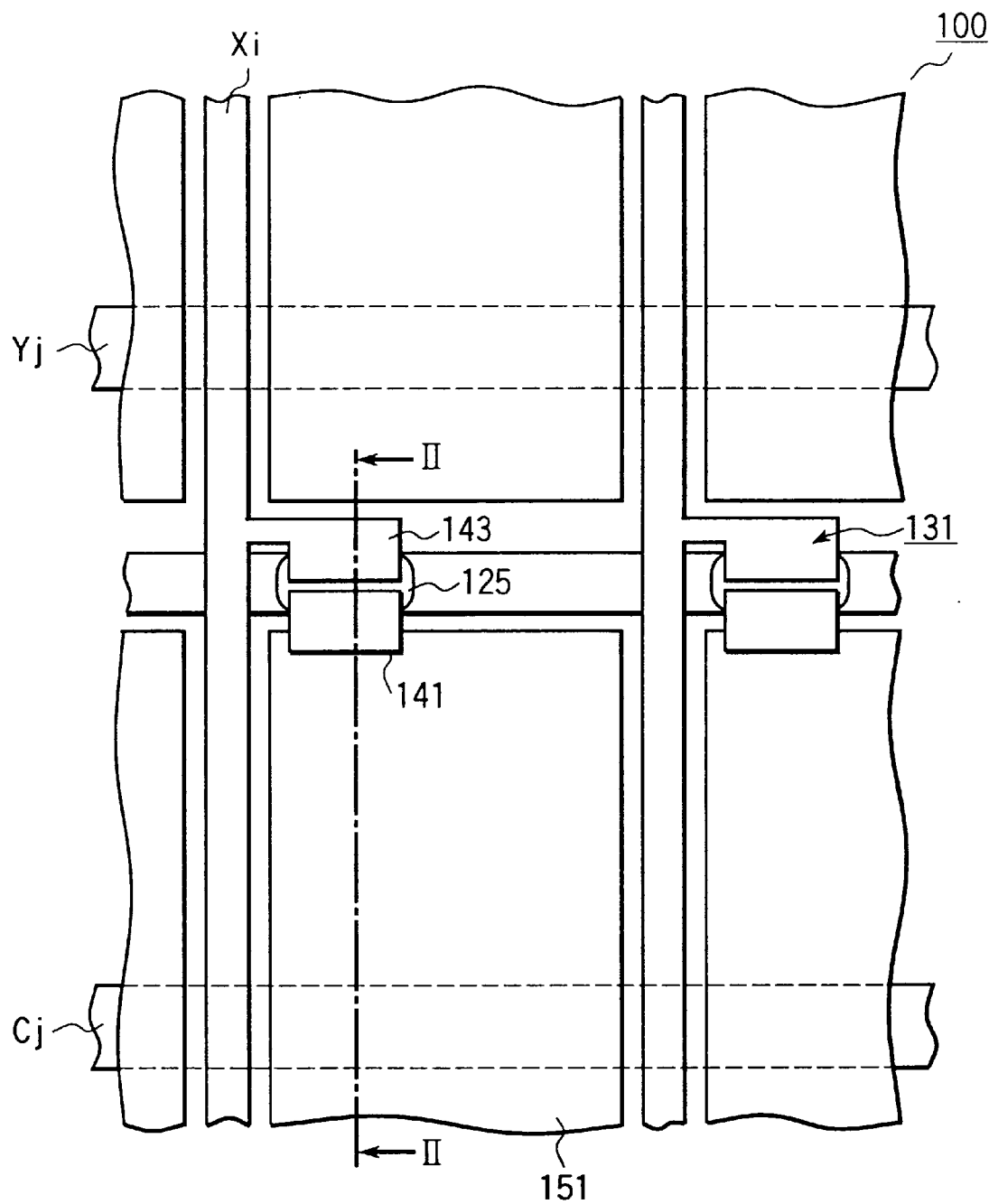
FIG. 1 is a schematic front view showing a part of an array substrate used in a liquid crystal display device of one embodiment of the present invention.
Figure 2:
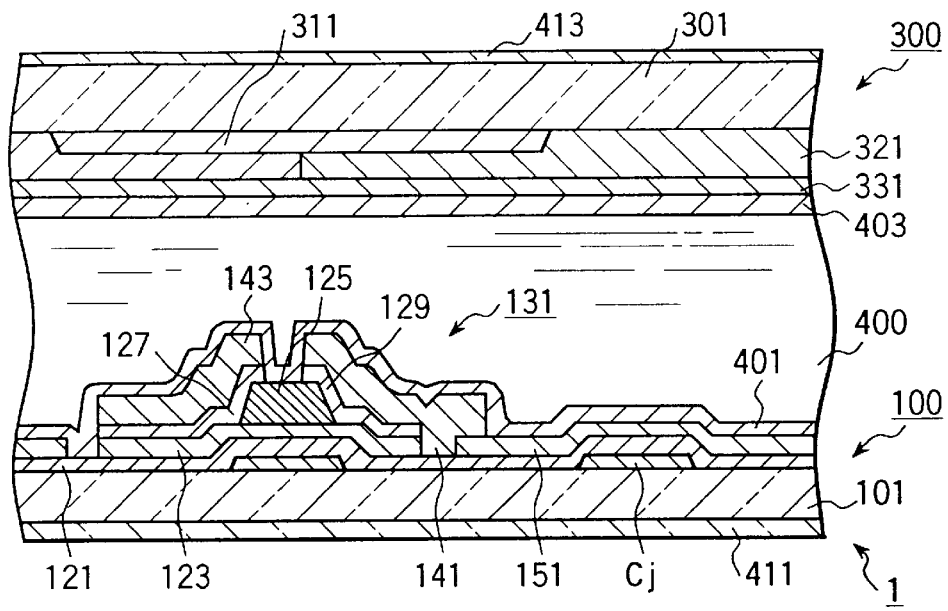
FIG. 2 is a schematic cross-sectional view of the liquid crystal display device cut along a line II—II of FIG. 1.

More specifically, FIG. 1 is a schematic plane view showing a part of an array substrate to which the embodiment of the present invention is applied. FIG. 2 is a schematic cross-sectional view of a liquid crystal display device cut along a line II—II of FIG. 1.

A liquid crystal display device 1 is a transmission type liquid crystal display device having an array substrate 100 and an opposite substrate 300.

Alignment films 401 and 403 are formed on a surface where the array substrate 100 is opposite to the opposite substrate 300, and a surface where the opposite substrate 300 is opposite to the array substrate 100, respectively. A liquid crystal composition 400 of a twisted nematic (TN) type is scaled between an alignment film on the substrate 100 and an alignment film on the substrate 300. Then, polarizing plates 411 and 413 are provided on the surfaces of the substrates 100 and 300 such that their polarizing axes are perpendicular to each other.

The array substrate 100 has signal lines Xi (of 800×3= 2400) (i=1, 2, . . . , 2400), and 600 scanning lines Yj (j=1, 2, . . . , 600) on a transparent insulating substrate 101 formed of glass. Each signal line Xi and each scanning line Yj are arranged to intersect with each other. Also, storage capacitor lines Cj (j=1, 2, . . . , 600) to be described later are arranged to be parallel to the scanning lines Yj.

Each TFT 131 is provided at each intersection point of the signal line Xi and the scanning line Yj. A source electrode 141 of TFT 131 is electrically connected to a pixel electrode 151 formed by ITO (Indium Thin Oxide).

TFT 131 is formed on the scanning line Yj such that the scanning line Yj is used as a gate electrode. In other words, an insulating film 121, which is formed of silicon oxide ($SiO_2$), and a semiconductor film 123, which is formed of hydrogenated non-crystalline silicon (a-Si:H), are sequentially layered on the scanning line Yj.

A channel protection film 125, which is self-aligned on the scanning line Yj, and a drain electrode 143 are layered on the semiconductor film 123. The drain electrode 143 is electrically connected to the semiconductor film 123 by an ohmic contact film 127, which is formed of an n+ type non-crystalline thin film. The drain electrode 143 and the signal line Xi are formed in the same layer. Also, the source electrode 141 is electrically connected to the semiconductor film 123 by an ohmic contact film 129 which is formed of an n+ type non-crystalline thin film. The pixel electrode 151 is electrically connected to the source electrode 141 are formed in the same layer.

Storage capacitor lines Cj (j=1, 2, . . . , 600) are arranged in the pixel electrode 151 to be overlaid on an insulating film 121, which is formed of $SiO_2$. Thereby, an storage capacitor (Cs) is formed between the pixel electrode 151 and the storage capacitor line Cj.

Each of the scanning line Yj and the storage capacitor line Cj are formed of an aluminum alloy having a wire width of 10 $\mu$m. On the other hand, the signal line Xi is formed by layering molybdenum (Mo) and aluminum (Al) to have a wire width of 5 $\mu$m.

The opposite substrate 300 includes a transparent insulating substrate 301, formed of e.g., glass, such that a distance between the signal line Xi and the pixel electrode 151 and a distance between the scanning line Yj and the pixel electrode 151 are set to predetermined values, respectively. The transparent insulating substrate 301 is placed to have a fixed distance between the transparent substrate 301 and the array substrate 100. A black resin opaque film 311 is formed on the transparent substrate 301 with a predetermined distance in order to prevent light from being introduced to TFT 131 from the substrate 301. Moreover, a color filter 321 of one of red (R), green (G), or blue (B) is formed on the transparent substrate 301 to be placed in an area excepting the opaque film 311. The color filter 321 and the opaque film are covered with an opposite electrode 331, formed of ITO.

The following will explain the manufacturing method of the liquid crystal display device 1.

Figure 3:
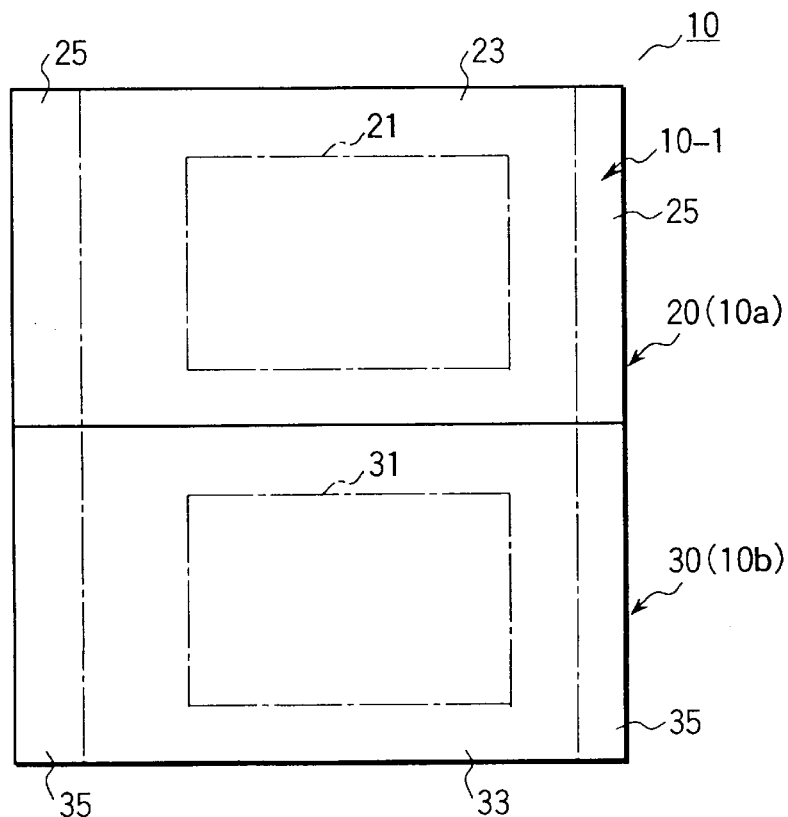
FIG. 3 is a schematic front view showing the array substrate used in the liquid crystal display device of the embodiment of the present invention.

As shown in FIG. 3, an array substrate 10 has a surface area 10-1 which includes a first substrate area 10a and a second substrate area 10b. The first substrate area 10 a corresponds to an array substrate 20 for a first display device. The second substrate area 10b corresponds to an array substrate 30 for a second display device having substantially the same structure as the array substrate 20. In other words, the array substrate 10 provides two array substrates 20 and 30 as one body at the same time.

The array substrates 20 and 30 (first substrate area 10a, second substrate area 10b) includes display areas 21, 31, peripheral areas 23, 33, and mark areas 25, 35, respectively. Each of the display areas 21 and 31 has a plurality of pixel electrodes arrayed. Each of the peripheral areas 23 and 33 includes a connection pad, which is placed on the outer periphery of each of the display areas 21 and 31, and also includes a short ring. Each of the mark areas 25 and 35 includes an alignment mark, which is placed on the outer periphery of the peripheral area and removed as a final form, a cut mark, or the short ring.

The liquid crystal display device 1 shown in FIGS. 1 and 2 comprises the array substrate 100. The array substrate 100 can be obtained as follows:

Specifically, the array substrates 20 and 30, which are provided by the array 10 at the same time, are used to structure two liquid crystal panels, and the mark areas 25 and 35 are cut so that they can be removed.

In other words, the array substrate 100 has a screen size, which is provided by the array substrate 20 or 30. Therefore, two array substrates 100 are provided by the array substrate 10.

FIGS. 4A to 4E are schematic views explaining the manufacturing process of the array substrate 10 of FIG. 3 in order.

Figure 4A:
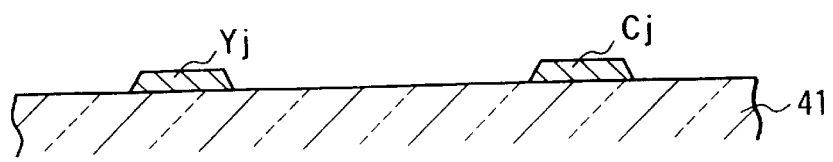
FIGS. 4A to 4E are views each showing the manufacturing process of the array substrate used in the liquid crystal display device of the embodiment of the present invention.

First, an aluminum alloy film is deposited on the entire surface of a large-sized transparent insulating substrate 41, which is formed of glass, by sputtering. Then, the deposited aluminum alloy film is coated with resist, and the resultant resist is exposed and developed, and patterned. As a result, as shown in FIG. 4A, 600 scanning lines Yj and the storage capacitor lines Cj are formed at the same time. In FIG. 4A, various alignment marks (not shown) are formed on the periphery at the time of forming the scanning lines Yj and the storage capacitor lines Cj.

A plurality of masks are combined to be used as a mask for resist exposure as explained below with reference to FIGS. 5 and 6A to 6D.

As shown in FIG. 5, in the large-sized transparent insulating substrate 41, the first substrate area 10a, which corresponds to the array substrate 20 for the first display device, is divided into 17 areas Div. 1-1 to Div. 1-17. Also, the second substrate area 10b, which corresponds to the array substrate 30 for the second display device, is divided into 17 areas Div. 2-1 to Div. 2-17. The areas Div. 1-5 to Div. 1-8 and Div. 1-10 to Div. 1-13, and the areas Div. 2-5 to Div. 2-8 and Div. 2-10 to Div. 2-13 correspond to the display areas 21 and 31 explained by use of FIG. 3, and the other areas correspond to peripheral areas 23 and 33 or mark areas 25 and 35.

As shown in FIG. 5, the number of masks, which are necessary to form the array substrates 20 and 30 at the same time, is nine, that is, $A_1$, $b_1$, $b_2$, $b_3$, $t_1$, $t_2$, $t_3$, $l_1$, and $r_1$.

FIGS. 6A to 6D are schematic views showing the examples of the masks in which the number of the masks of FIG. 5 can be reduced.

1-1 mask includes mask pattern Al to be used to prepare the scanning lines Yj, and the storage capacitor lines Cj in the display areas 21 and 31.

1-2 mask is used to prepare the peripheral areas 23 and 33 and the mark areas 25 and 35. The mask patterns $b_1$ and $t_1$ are formed to be in contact with each other in the same mask.

1-3 mask is used to prepare the peripheral areas 23 and 33 and the mark areas 25 and 35. The mask patterns $b_2$ and $t_2$ are formed to be in contact with each other in the same mask. Also, the mask patterns $b_3$ and $t_3$ are formed to be in contact with each other in the same mask. The mask patterns $b_2$ and $t_2$, and the mask patterns $b_3$ and $t_3$ are arranged to have a predetermined distance.

1-4 mask is used to prepare the peripheral areas 23 and 33 and the mark areas 25 and 35. The mask patterns $l_1$ and $r_1$ are formed to have a predetermined distance in the same mask.

The following will explain that the array substrates 20 and 30 are formed at the same time by use of 1-1 to 1-4 masks.

First, 1-2 mask is used so that the mask pattern $b_1$ is shielded. Then, the area Div. 1-1 is exposed by mask pattern $t_1$. Next, the shielding is released, and the areas Div. 1-14 and Div. 2-1 are exposed at the same time by the mask patterns $b_1$ and $t_1$. Sequentially, the mask pattern $t_1$ is shielded, and the area Div. 2-14 is exposed.

Next, 1-3 mask is used to shield the mask patterns $b_2$ and $b_3$, and $t_3$. Then, the areas Div. 1-2, and Div. 1-3 are exposed twice by the mask pattern $t_2$. Thereafter, the mask patterns $b_3$ and $t_3$ are shielded, and the areas Div. 1-15 and Div. 2-2 are exposed at the same time. Sequentially, the areas Div. 1-16 and Div. 2-3 are exposed at the same time. Next, the mask patterns $b_2$ and $t_2$ are shielded, and the areas Div. 1-17 and Div. 2-4 are exposed at the same time by the mask patterns $b_3$ and $t_3$. Sequentially, the mask patterns $t_2$, $b_3$ and $t_3$ are shielded, and the areas Div. 2-15 and Div. 2-16 are exposed twice by the mask pattern $b_2$. Then, the mask patterns $b_2$, $t_2$, and $t_3$ are shielded, and the area Div. 2-17 is exposed by the mask patterns $b_3$.

Next, 1-4 mask is used so that the mask pattern $r_1$ is shielded. Then, the areas Div. 1-9 and Div. 2-9 are sequentially exposed by the mask patterns $l_1$. Thereafter, the mask pattern $l_1$ is shielded, and the areas Div. 1-8, Div. 1-13, Div. 2-8, and Div. 2-13 are sequentially exposed by the mask pattern $r_1$.

Finally, 1-1 mask is used, so that the areas Div. 1-5 to Div. 1-8, Div. 1-10 to Div. 1-13, and Div. 2-5 to Div. 2-8, and Div. 2-10 to Div. 2-13 are respectively exposed by the mask pattern $A_1$.

Thus, the entire surface of the substrate 10 is exposed, so that the scanning lines Yj, the storage capacitor lines Cj, the connection pad (not shown), the aligning mark, and the short ring, etc. can be formed.

According to the above-mentioned method, the first substrate area 10a, which corresponds to the array substrate 20, and the second substrate area 10b, which corresponds to the array substrate 30, can be exposed by the same mask. As a result, though 34 division areas are prepared, the number of exposures can be set to 30 times. As a result, the exposing time can be reduced.

Moreover, nine kinds of mask patterns, which are necessary to expose the entire surface of the substrate 10, are stored in four masks. As a result, time for exchanging the mask can be largely reduced.

Figure 4B:
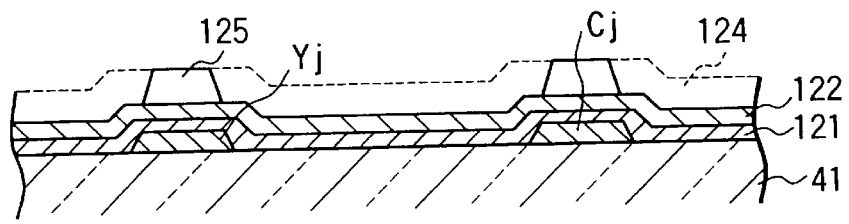

Next, the silicon oxide film (SiO2), serving as insulating film 121, a hydrogenated non-crystalline silicon thin film (a-Si:H) 122, and a silicon nitrogen film (SiNx) 124 are continuously deposited without being exposed in air. Thereafter, the scanning line Yj is used as a mask, and the scanning line Yj is exposed from the back surface of the substrate 101. Thereby, the silicon nitrogen film (SiNx) 124 is patterned, and the channel protection film 125, which is self-aligned to the scanning lines Yj of FIG. 4B, is formed.

In this case, the exposure, excepting the exposure of the mark areas 25 and 35, is performed to reduce the number of exposures. More specifically, as shown in FIG. 7, in the large-sized transparent insulating substrate 41, the display area 21 and the peripheral area 23, excepting non-exposure areas Div. 3 and Div. 4 corresponding to the mark areas 25 and 35, are divided into eight areas Div. 1-1 to Div. 1-8. Also, the display areas 31 and the peripheral area 33 are divided into eight areas, Div. 2-1 to Div. 2-8.

In this case, four masks shown in FIGS. 8A to 8D are used to perform the division exposure efficiently with the small number of masks.

Figure 8A:
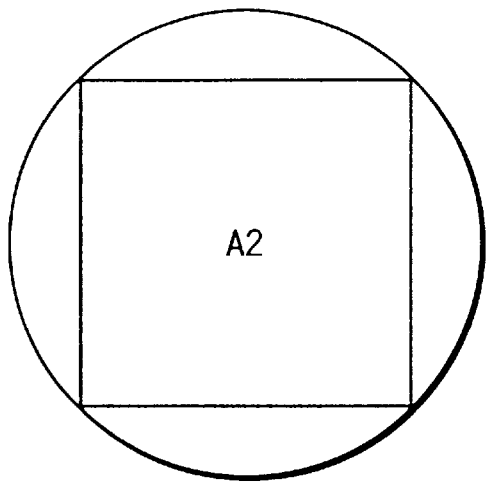
FIGS. 8A to 8D are views each explaining an allocation of the mask pattern used in exposing the division areas of FIG. 7.
Figure 8B:
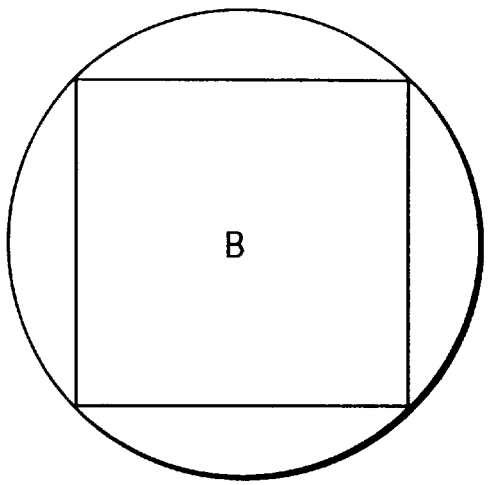
Figure 8C:
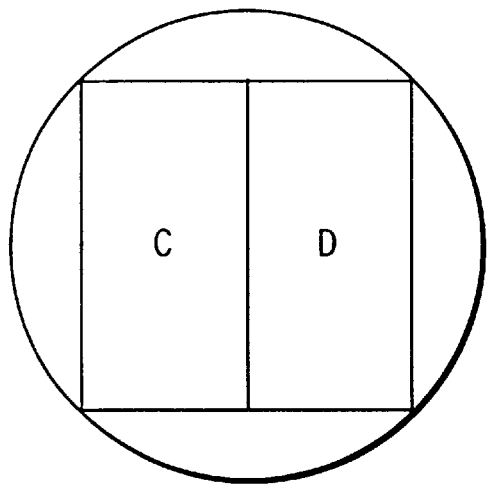
Figure 8D:
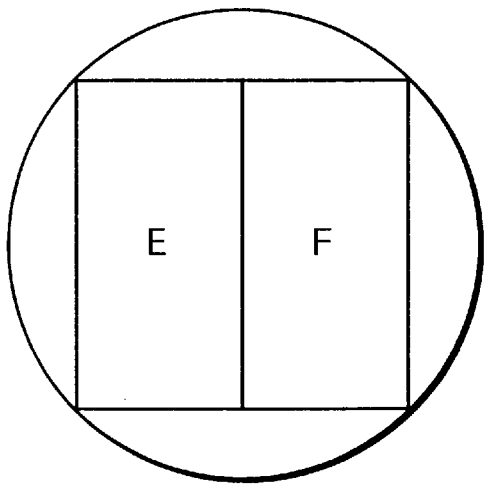

As shown in FIG. 8A, 2-1 mask includes a mask pattern $A_2$, which corresponds to the display areas 21 and 31. As shown in FIG. 8B, 2-2 mask includes mask pattern B, which corresponds to the peripheral areas 23 and 33. As shown in FIG. 8C, 2-3 mask is formed such that mask patterns C and D, which correspond to the display areas 21 and 31 and the peripheral areas 23 and 33, are in contact with each other in the same mask. Moreover, as shown in FIG. 8D, 2-4 mask is formed such that mask patterns E and F, which correspond to the display areas 21 and 31 and the peripheral areas 23 and 33, are in contact with each other in the same mask.

In this case, firstly, the mask pattern $A_2$ is exposed to the areas Div. 1-2 and Div. 1-3 and areas Div. 2-2 and Div. 2-3 by using the 2-1 mask, sequentially.

Next, the mask is changed to the 2-2 mask, and the mask pattern B is exposed to the areas Div. 1-6 and Div. 1-7 and areas Div. 2-6 and Div. 2-7 by using the 2-2 mask, sequentially.

Next, the mask is changed to the 2-3 mask, and the mask pattern D is shielded, and areas Div. 1-1 and Div. 2-1 are exposed. Also, the mask pattern C is shielded, and areas Div. 1-4, and Div. 2-4 are exposed.

Thereafter, the mask is changed to the 2-4 mask, and the mask pattern F is shielded, and areas Div. 1-5 and Div. 2-5 are exposed. Also, the mask pattern E is shielded, and areas Div. 1-8, and Div. 2-8 are exposed.

Thus, in the large-sized transparent insulating substrate 41, the display area and the peripheral area, excepting the areas Div. 3 and Div. 4 corresponding to the mark areas 25 and 35, are exposed, so that the channel protection film 125 is formed.

As explained above, the array substrates 20 and 30 are exposed by use of the same mask. In this case, the areas except the areas Div. 3 and Div. 4 are exposed. As a result, the number of exposures can be set to 16, so that exposure time can be reduced. Moreover, since six kinds of mask patterns, which are necessary to complete the exposure, are stored in four masks, the time necessary to exchange the masks, can be largely reduced.

Figure 4C:
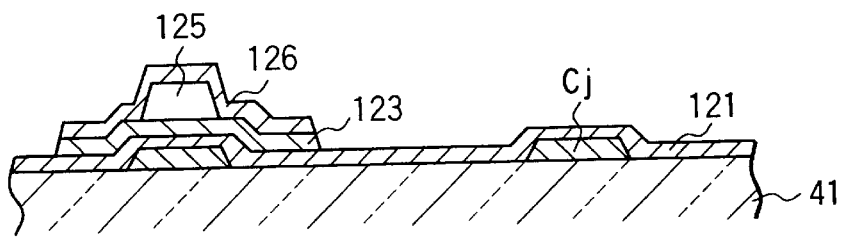

Thereafter, n+ type non-crystalline silicon thin film is deposited, and hydrogenated non-crystalline silicon (a-Si:H) thin film and n+ type non-crystalline silicon thin film are patterned to be island-shaped. Thereby, the semiconductor film 123 as shown in FIG. 4C and an island-like n+ non-crystalline silicon thin film 126 are obtained. n the exposing method of this case, the area is divided in the same manner as the formation of the channel protection film 125. Since the exposure, excepting the areas Div. 3 and Div. 4, is completed, the number of exposures can be set to 16. Thereby, exposure time can be reduced. Moreover, since six kinds of mask patterns, which are necessary to complete the exposure, are stored in four masks, the time necessary to exchange the masks can be largely reduced.

Figure 4D:
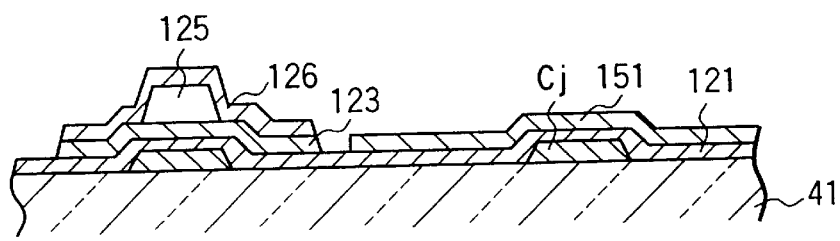

Thereafter, an ITO film is deposited and patterned, so that a pixel electrode 151 is formed as shown in FIG. 4D. In the exposing method of this case, the area is divided in the same manner as the formation of the channel protection film 125. Since the exposure, excepting to areas Div. 3 and Div. 4, is completed, the number of exposures can be set to 16. Thereby, exposure time can be reduced. Moreover, since six kinds of mask patterns, which are necessary to complete the exposure, are stored in four masks, the time necessary to exchange the masks, can be largely reduced.

Figure 4E:
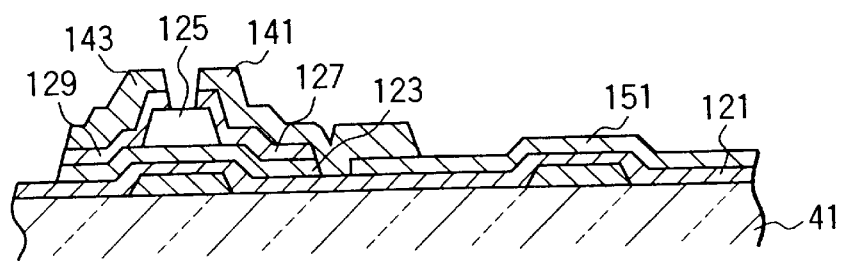
Figure 6A:
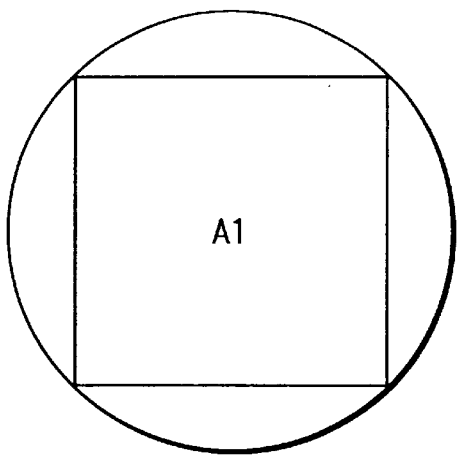
FIGS. 6A to 6D are views each explaining an allocation of the mask pattern used in exposing the division areas of FIG. 5.
Figure 6B:
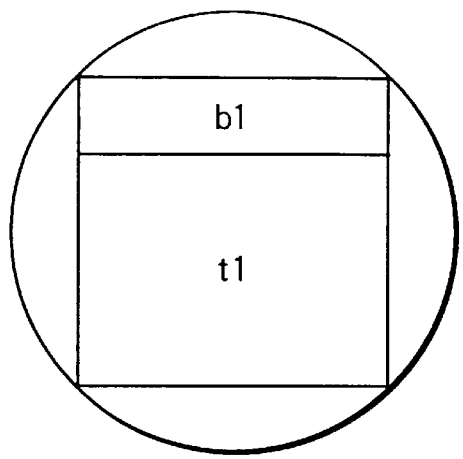
Figure 6C:
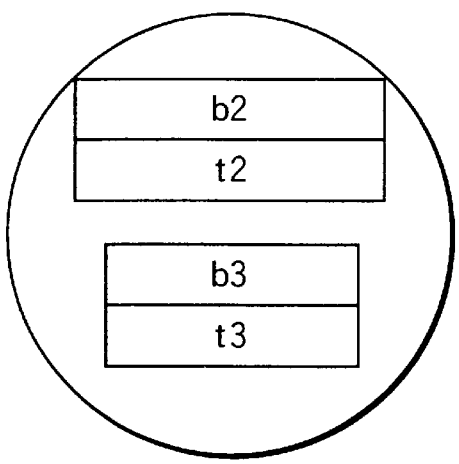
Figure 6D:
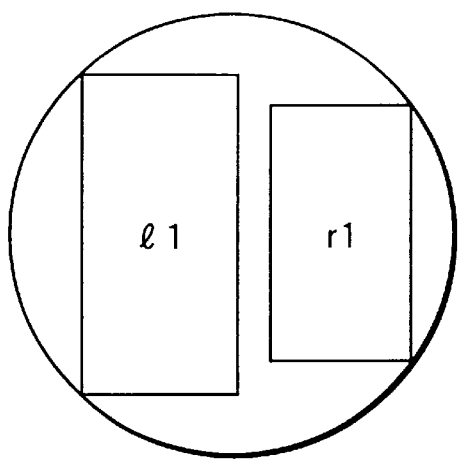

Next, a molybdenum film and an aluminum film are continuously deposited by sputtering to be patterned. Thereby, as shown in FIG. 4E, the signal line X1, which comprises a layer body of the molybdenum film and the aluminum film, and the drain electrode 143 are formed. At the same time, there can be obtained the source electrode 141, which is the layer body of the molybdenum film and the aluminum film, and which is electrically connected to the pixel electrode 151. At the same, the island-like n+ non-crystalline silicon thin film 126 is patterned. As a result, there can be obtained an ohmic contact layer 129, which is formed between the drain electrode 143 and the semiconductor film 123, and an ohmic contact layer 127, which is formed between the source electrode 141 and the semiconductor film 123. In this case, the area is divided in the same manner as in the formation of the channel protection film 125. Since the exposure, excepting the areas Div. 3 and Div. 4, is completed, the number of exposures can be set to 16. Thereby, exposure time can be reduced. Moreover, since six kinds of mask patterns, which are necessary to complete the exposure, are stored in four masks, the time necessary to exchange the masks, can be largely reduced.

Thus, in the large-sized transparent insulating substrate 41, the array substrate 10 including the array substrates 20 and 30 is completed.

Thereafter, the array substrates 20 and 30 are separated from each other to prepare each liquid crystal panel. Thereafter, mark areas 25 and 35 are removed, so that the liquid crystal display device 1 having array substrate 100 is formed.

As explained above, only when patterning the mark areas 25 and 35 at the same time is the entire surface of the large-sized transparent insulating substrate 41 exposed. Then, in the other case, only the display areas 23 and 33, and the peripheral areas 25 and 35 are exposed. As a result, the number of exposures is set to 30 times, only when the mark areas 25 and 35 are patterned at the same time. In the other case, the number of exposures can be set to 16 times. Therefore, time, which is needed to complete the exposure, can be largely reduced.

Moreover, since the plurality of mask patterns are arranged in the same mask, the number of masks required for each exposure can be set to four.

Furthermore, two adjacent division areas of the first area 10a, which corresponds to the array substrate 20, and the second area 10b, which corresponds to the array substrate 30, are exposed by the same mask. As a result, the number of exposing times can be reduced, so that productivity can be improved.

In the above-explained embodiment, the peripheral areas 25 and 35 were exposed at the time of exposing the scanning lines Yj and the storage capacitor line Cj. However, the periphery areas 25 and 35 may be exposed when forming the signal line Xi and the other patterns.

The above embodiment explained the case of TFT using the hydrogenated non-crystalline silicon (a-Si:H) thin film and the semiconductor layer. However, the present invention can be applied to any of a case using polycrystal silicon as a semiconductor layer, a case using microcrystal silicon as a semiconductor layer, or a case using single crystal silicon as a semiconductor layer.

The above embodiment explained the case of the array substrate for the display device using TFTs as switch elements and the active matrix type liquid crystal display device using the array substrate. However, two-terminal non-linear element such as MIM other than TFT can be suitably used as a switch element.

Moreover, if a polymer dispersion type liquid crystal is used as a liquid crystal composition, both an orientation film and a polarizing plate can be omitted.

Furthermore, if the pixel electrode is formed of high reflective material such as aluminum in place of the ITO film or the reflected plate is adhered onto the back surface of the array substrate, the present invention can be applied to a reflection type liquid crystal display device.

As explained above, according to the present invention, while using the highly accurate exposure technique, increases in manufacturing time and in cost can be restrained in manufacturing the array substrate for the display device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method of manufacturing an array substrate for a display device having a surface area including a display area having a plurality of pixel electrodes arranged on a main surface of an insulating substrate, a peripheral area positioned at the outside of the display area to supply a drive voltage to the display area, and a mark area positioned at the outside of the peripheral area, comprising:

forming a first layer on the main surface of the insulating substrate;

forming a first resist on the first layer;

patterning the first layer by exposing the first resist using a plurality of mask patterns which correspond to each area obtained by patterning one surface area using the plurality of mask patterns;

forming a second layer on the first layer;

forming a second resist on the second layer; and patterning the second layer except for the mark area by exposing the second resist using a plurality of mask patterns which correspond to each area obtained by patterning one surface area using the plurality of mask patterns.

2. The method according to claim 1, further comprising removing the mark area of the insulating substrate.

3. A method of manufacturing an array substrate for a display device having a surface area including a display area having a plurality of pixel electrodes arranged on a main surface of an insulating substrate, a peripheral area positioned at the outside of the display area to supply a drive voltage to the display area, and a mark area positioned at the outside of the peripheral area, comprising:

forming a first layer on the main surface of the insulating substrate;

forming a first resist on the first layer;

patterning the first layer except for the mark area by exposing the first resist using a plurality of mask patterns which correspond to each area obtained by patterning one surface area using the plurality of mask patterns;

forming a second layer on the first layer;

forming a second resist on the second layer; and patterning the second layer by exposing the second resist using a plurality of mask patterns which correspond to each area obtained by patterning one surface area using the plurality of mask patterns.

4. The method according to claim 3, further comprising removing the mark area of the insulating substrate.

5. A method of manufacturing an array substrate for a display device having a surface area including a first substrate area having a first display area having a plurality of pixel electrodes arranged on a main surface of a first insulating substrate and a second substrate area having a second display area having a plurality of pixel electrode arranged on the main surface of a second insulating substrate, comprising:

forming a first layer on a main surface of the first and second insulating substrate;

forming a resist on the first layer; and patterning the first layer by exposing the resist using a plurality of masks, wherein adjacent corresponding areas of the first substrate and the second substrate are patterned with a common mask having two mask patterns each used in each of the first substrate and the second substrate.

6. The method according to claim 5, wherein patterning the first layer is performed by a plurality of masks wherein each of the plurality of masks has at least two mask patterns.

7. A method of manufacturing an array substrate for a display device having a surface area including a display area having a plurality of pixel electrodes arranged on a main surface of an insulating substrate, comprising:

forming a first layer on a main surface of the insulating substrate;

forming a resist on the first layer; and patterning the first layer of the main surface of the insulating substrate by exposing the resist using a plurality of mask patterns which correspond to each area obtained by patterning one surface area using the plurality of mask patterns, wherein two areas of the each area are patterned by using a mask, said mask has two mask patterns corresponding to each of the two areas.

* * * * *